United States Patent
Chang et al.

(10) Patent No.: US 11,670,597 B2
(45) Date of Patent: Jun. 6, 2023

(54) METHOD FOR FORMING PACKAGE STRUCTURE

(71) Applicant: Taiwan Semiconductor Manufacturing Company, Ltd., Hsinchu (TW)

(72) Inventors: Chin-Chuan Chang, Zhudong Township, Hsinchu County (TW); Szu-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/400,731

(22) Filed: Aug. 12, 2021

(65) Prior Publication Data

US 2021/0375772 A1 Dec. 2, 2021

Related U.S. Application Data

(62) Division of application No. 16/548,202, filed on Aug. 22, 2019, now Pat. No. 11,094,635.

(51) Int. Cl.
*H01L 23/538* (2006.01)
*H01L 23/00* (2006.01)
(Continued)

(52) U.S. Cl.
CPC ........ *H01L 23/5386* (2013.01); *H01L 21/486* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5384* (2013.01);
(Continued)

(58) Field of Classification Search
CPC ............. H01L 21/4853; H01L 21/4857; H01L 21/565; H01L 21/6835; H01L 21/78; H01L 24/16; H01L 2221/68372; H01L 2224/16225

See application file for complete search history.

(56) References Cited

U.S. PATENT DOCUMENTS 8,993,380 B2  3/2015  Hou et al.
9,048,233 B2  6/2015  Wu et al.
(Continued)

*Primary Examiner* — Peniel M Gumedzoe

(74) *Attorney, Agent, or Firm* — McClure, Qualey & Rodack, LLP

(57) ABSTRACT

A method for forming a package structure is provided. The method includes forming a first molding compound layer surrounding a first interposer. The method also includes forming a first redistribution structure over a first side of the first interposer and the first molding compound layer. The method also includes bonding a first semiconductor die and a second semiconductor die to the first redistribution structure through a plurality of first connectors. The method also includes bonding a surface-mount device (SMD) to the first redistribution structure through a second connector. The method also includes forming a second redistribution structure over a second side of the first interposer opposite the first side of the first interposer. A top surface of the surface-mount device (SMD) is lower than top surfaces of the first semiconductor die and the second semiconductor die.

20 Claims, 16 Drawing Sheets

(51) Int. Cl.
*H01L 23/31* (2006.01)
*H01L 21/48* (2006.01)
*H01L 21/56* (2006.01)
*H01L 21/78* (2006.01)
*H01L 21/683* (2006.01)
*H01L 25/00* (2006.01)
*H01L 25/065* (2023.01)

(52) U.S. Cl.
CPC .......... *H01L 24/16* (2013.01); *H01L 25/0655* (2013.01); *H01L 25/50* (2013.01); *H01L 2221/68372* (2013.01); *H01L 2224/16225* (2013.01); *H01L 2924/19041* (2013.01); *H01L 2924/19103* (2013.01); *H01L 2924/19105* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,607,967 B1 | 3/2017 | Shih |
| 9,666,502 B2 | 5/2017 | Chen et al. |
| 9,735,131 B2 | 8/2017 | Su et al. |
| 2008/0149381 A1* | 6/2008 | Kawagishi ............ H01L 24/82 174/261 |
| 2012/0098123 A1 | 4/2012 | Yu |
| 2012/0152606 A1* | 6/2012 | Kurokawa ........ H01L 23/49827 174/262 |
| 2014/0027925 A1 | 1/2014 | Tseng et al. |
| 2014/0042643 A1 | 2/2014 | Yu |
| 2015/0048503 A1 | 2/2015 | Chiu |
| 2018/0286824 A1 | 10/2018 | Jeng et al. |
| 2019/0131223 A1 | 5/2019 | Chang et al. |

* cited by examiner

METHOD FOR FORMING PACKAGE STRUCTURE

CROSS REFERENCE TO RELATED APPLICATIONS

This application is a Divisional application of U.S. patent application Ser. No. 16/548,202, filed on Aug. 22, 2019, now U.S. Pat. No. 11,094,635, the entirety of which are incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes a smaller area or a lower height, in some applications.

New packaging technologies have been developed to improve the density and functionality of semiconductor dies further. For example, three-dimensional integrated circuit (3D-IC) packages have been developed. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
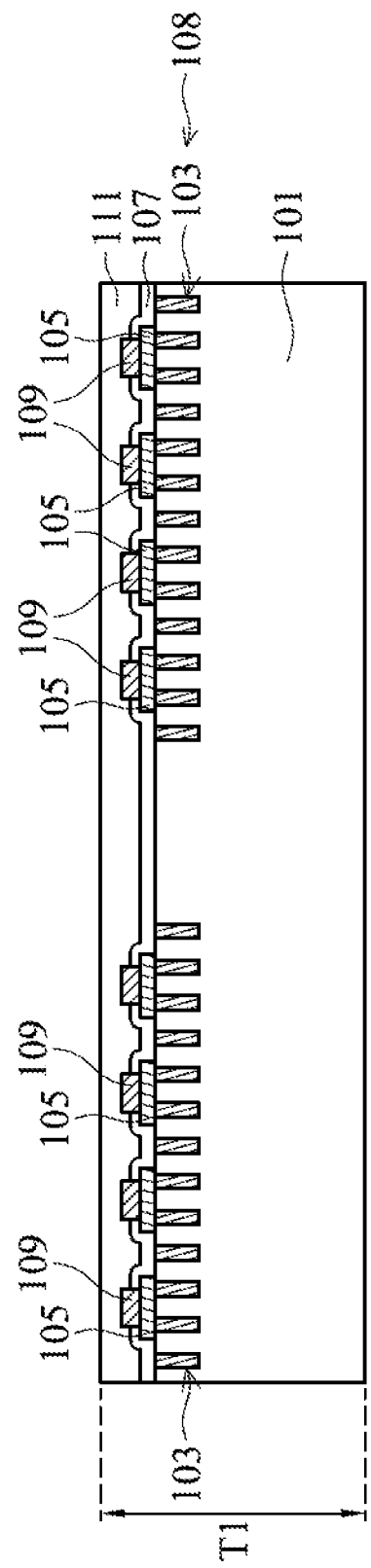
FIGS. 1A to 1L are cross-sectional views of various stages of a process for forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of a package structure and method for forming the same are provided. The package structure may include a first redistribution structure and an interposer over the first redistribution structure. The package structure may also include a molding compound layer surrounding the interposer, and a second redistribution structure over the interposer. By disposing the first and second redistribution structures on two opposite sides of the interposer, additional electrical components (e.g., surface-mount devices (SMDs)) may be integrated into the package structure without any additional substrate (e.g. printed circuit board (PCB)).

FIGS. 1A to 1L are cross-sectional views of various stages of a process for forming a package structure 100, in accordance with some embodiments of the disclosure.

An interposer wafer 108 is received, as shown in FIG. 1A in accordance with some embodiments. In some embodiments, the interposer wafer 108 has a substrate 101, a plurality of through vias 103 in the substrate 101, and a plurality of conductive pads 105 and a passivation layer 107 over the substrate 101. The substrate 101 for the interposer wafer 108 may be, e.g., a silicon substrate, doped or undoped, or an active layer of a silicon-on-insulator (SOI) substrate, used to provide support for the interposer wafer 108. However, the substrate 101 may alternatively be a glass substrate, a ceramic substrate, a polymer substrate, or any other substrate that may provide a suitable protection and/or interconnection functionality.

The through vias 103 may serve as conductive vias to provide electrical connections in vertical directions. In some embodiments, the through vias 103 are formed by applying and developing a photoresist over the substrate 101, and then etching the substrate 101 to generate openings. Afterwards, the openings for the through vias 103 may be filled with a barrier layer (not shown) and a conductive layer.

The barrier layer may include a conductive material such as titanium nitride, although other materials, such as tantalum nitride, titanium, a dielectric, or the like may alternatively be utilized. The barrier layer may be formed by using a chemical vapor deposition (CVD) process, such as plasma enhanced chemical vapor deposition (PECVD). However, other alternative processes, such as sputtering or metal organic chemical vapor deposition (MOCVD), may alternatively be used. The barrier layer may be formed so as to contour to the underlying shape of the openings for the through vias 103.

The conductive layer of the through vias 103 may be made of copper, cobalt, titanium, aluminum, tungsten, gold, platinum, nickel, one or more other applicable materials, or a combination thereof. The conductive layer may be formed by depositing a seed layer and then electroplating the conductive layer onto the seed layer, filling and overfilling the openings for the through vias 103. Once the openings for the through vias 103 have been filled, excess barrier layer and excess conductive layer outside of the openings for the through vias 103 may be removed through a planarization process.

The planarization process may include a grinding process, a chemical mechanical polishing (CMP) process, a dry polishing process, an etching process, a cutting process, one or more other applicable processes, or a combination thereof. After the planarization process, surfaces of the through vias 103 are substantially level with a surface of the substrate 101. Within the context of this specification, the word "substantially" means preferably at least 90%.

The conductive pads 105 are formed over the through vias 103, as shown in FIG. 1A in accordance with some embodiments. The conductive pads 105 may be used to form electrical connections between some of the through vias 103. The conductive pads 105 may be made of aluminum, copper, another applicable material, or a combination thereof. The conductive pads 105 may be formed by a deposition process, such as sputtering, to form a layer of conductive material (not shown) over the substrate 101, and portions of the layer of conductive material may then be removed through an applicable process, such as photolithography and etching, to form the conductive pads 105.

The passivation layer 107 are formed over the through vias 103 and the substrate 101, as shown in FIG. 1A in accordance with some embodiments. In some embodiments, each of the conductive pads 105 is partially covered by the passivation layer 107. The passivation layer 107 may include openings that expose the conductive pads 105.

The passivation layer 107 may be made of or include polyimide (PI), poly-p-phenylenebenzobisthiazole (PBO), silicon nitride, silicon oxynitride, one or more other applicable materials, or a combination thereof. The passivation layer 107 may be formed by a spin coating process, a CVD process, a spray coating process, one or more other applicable processes, or a combination thereof. A patterning process may be used to make to passivation layer 107 with desired patterns.

After the interposer wafer 108 with the conductive pads 105 partially exposed by the passivation layer 107 is formed, a plurality of conductive pillars 109 are formed over the conductive pads 105, as shown in FIG. 1A in accordance with some embodiments. The conductive pillars 109 may be used to form electrical connections between the conductive pads 105 and the overlying semiconductor dies formed subsequently. In some embodiments, each of the conductive pillars 109 has a vertical sidewall.

In some embodiments, the conductive pillars 109 are made of copper, titanium, cobalt, aluminum, tungsten, gold, platinum, nickel, one or more other applicable materials, or a combination thereof. In some embodiments, the conductive pillars 109 are formed by using an electroplating method. Moreover, in some embodiments, the thickness of the conductive pillars 109 (i.e., the distance between the top surface of the conductive pillars 109 and the interface between the conductive pillars 109 and the conductive pads 105) is in a range from about 15 μm to about 25 μm.

Afterwards, a polymer layer 111 is formed over the passivation layer 107 and the conductive pillars 109, as shown in FIG. 1A in accordance with some embodiments. In some embodiments, top surfaces of the conductive pillars 109 are covered by the polymer layer 111, and sidewalls of the conductive pillars 109 adjoin the polymer layer 111 and the passivation layer 107.

In some embodiments, the polymer layer 111 is made of epoxy-based resin or another applicable polymer material, and the polymer layer 111 is formed by using a spin coating process, a spray coating process, one or more other applicable processes, or a combination thereof. In some embodiments, the polymer layer 111 is made of an epoxy-based resin with fillers dispersed therein. The fillers may include insulating fibers, insulating particles, other suitable elements, or a combination thereof. Moreover, the interposer wafer 108 and the polymer layer 111 may have a total thickness $T_1$. In some embodiments, the total thickness $T_1$ is in a range from about 750 μm to about 800 μm.

Figure 1B:
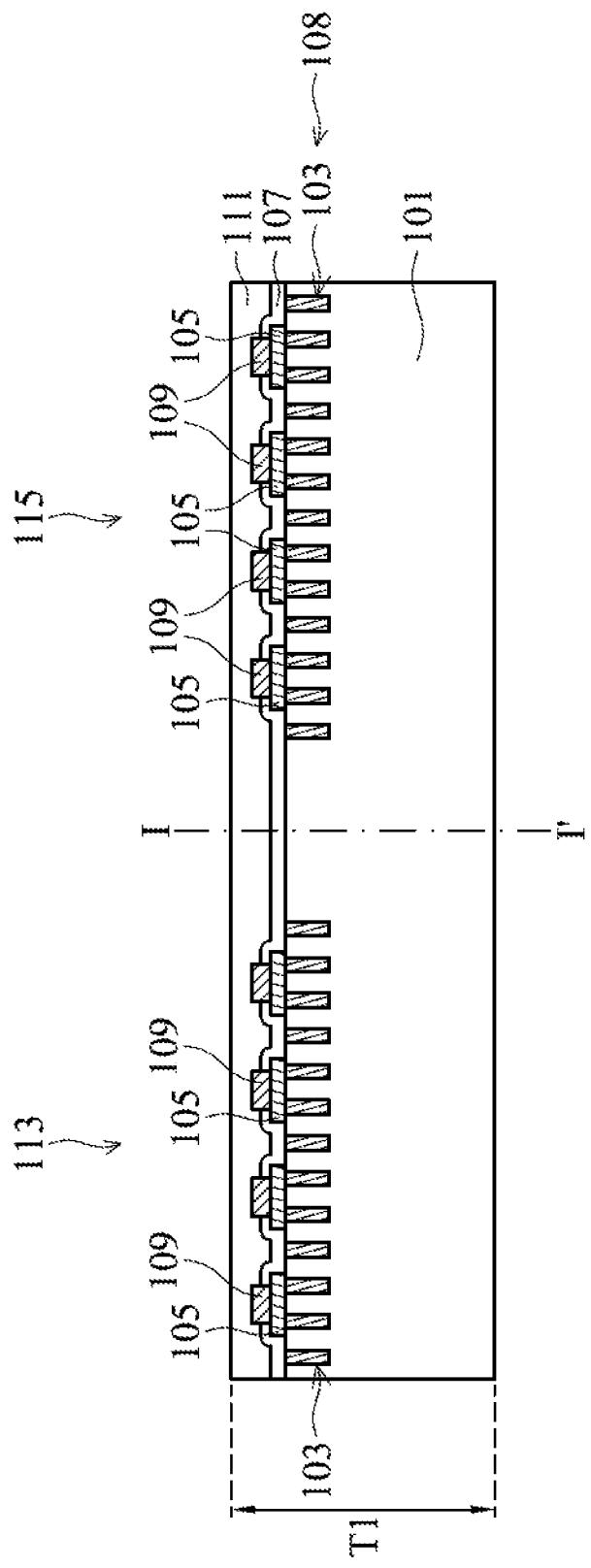

After the polymer layer 111 is formed, a dicing process is performed to cut the interposer wafer 108 in FIG. 1A into a plurality of interposers, such as interposer 113 and interposer 115, as shown in FIG. 1B in accordance with some embodiments. More specifically, the interposer wafer 108 in FIG. 1A is cut along scribe line I-I', and the polymer layer 111 is cut along with the interposer wafer 108, in accordance with some embodiments. Therefore, the edges of the polymer layer 111 are aligned with the respective edges of the interposers 113 and 115.

It should be noted that although four of the conductive pillars 109, four of the conductive pads 105, and thirteen of the through vias 103 are illustrated in each of the interposers 113 and 115 in FIG. 1B, the number of conductive pillars 109, the number of conductive pads 105, and the number of through vias 103 in the interposer 113 and 115 are not limited thereto.

Figure 1C:
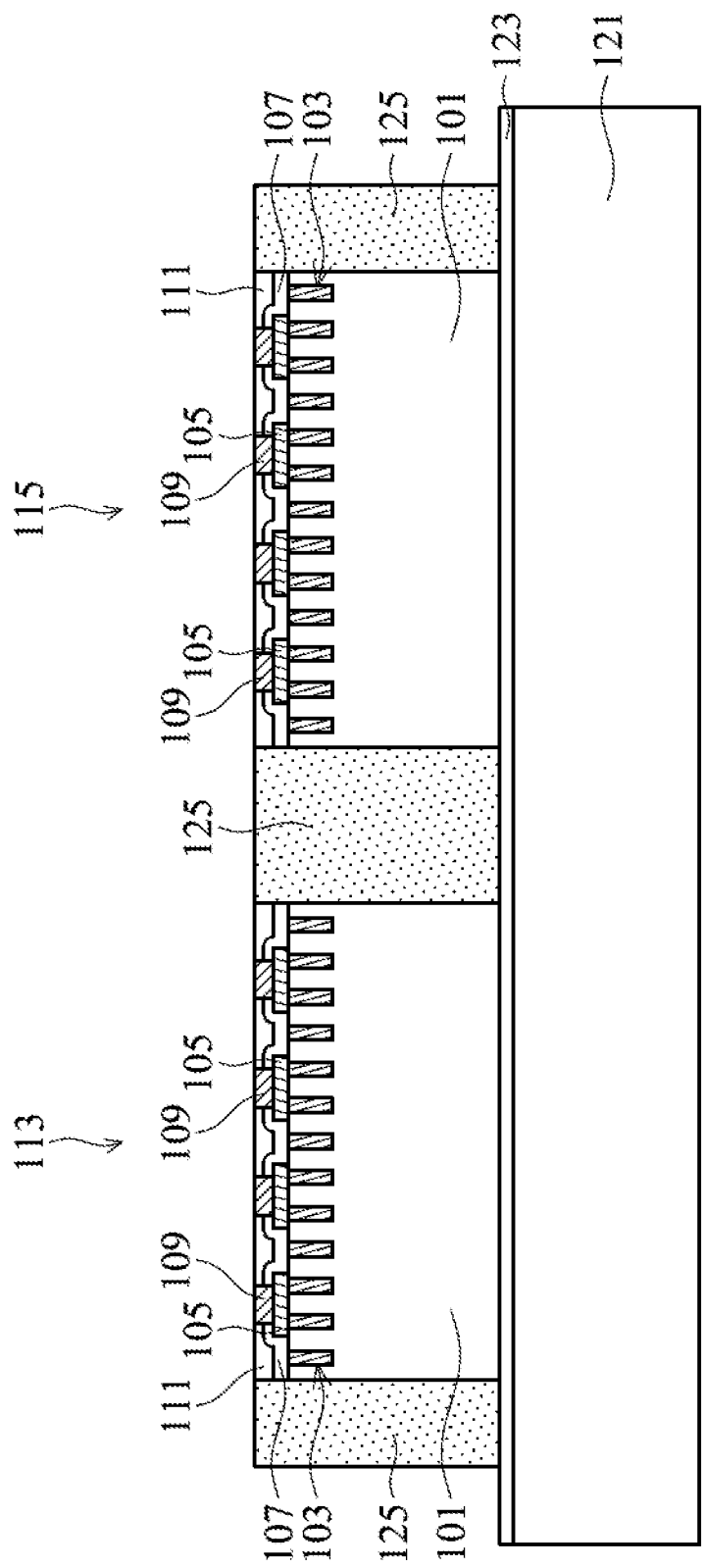

After the dicing process, the interposers 113 and 115 are placed over a first carrier substrate 121, as shown in FIG. 1C in accordance with some embodiments. In some embodiments, the interposers 113 and 115 are attached to the first carrier substrate 121 by an adhesive layer 123. The adhesive layer 123 may be used to affix the interposers 113 and 115.

In some embodiments, the first carrier substrate 121 is used as a temporary substrate. The temporary substrate provides mechanical and structural support during subsequent processing steps, such as those described in more detail later. In some embodiments, the first carrier substrate 121 is made of a semiconductor material, ceramic material, polymer material, metal material, another applicable material, or a combination thereof. In some embodiments, the first carrier substrate 121 is a glass substrate.

The adhesive layer 123 is used as a temporary adhesive layer, in accordance with some embodiments. The adhesive layer 123 may be glue or a tape. In some embodiments, the adhesive layer 123 is a photosensitive layer and is easily detached from the first carrier substrate 121 by light irradiation. For example, shining ultra-violet (UV) light or laser light on the first carrier substrate 121 is used to detach the adhesive layer 123. In some embodiments, the adhesive layer 123 is a light-to-heat-conversion (LTHC) coating. In some embodiments, the adhesive layer 123 is heat-sensitive and is easily detached from the first carrier substrate 121 when it is exposed to heat.

Moreover, a molding compound material (not shown) is formed covering the interposers 113 and 115, and then the molding compound material, the interposers 113 and 115 are thinned by using a planarization process to form a molding compound layer 125 surrounding and exposing the interposers 113 and 115, in accordance with some embodiments. More specifically, in some embodiments, upper portions of the polymer layer 111 in the interposers 113 and 115 are removed, such that the conductive pillars 109 of the interposers 113 and 115 are exposed by the molding compound layer 125.

The formation method of the molding compound material for forming the molding compound layer 125 may include an injecting process, a spin coating process, a spray coating process, one or more other applicable processes, or a combination thereof. The planarization process may include a grinding process, a CMP process, a dry polishing process, an etching process, a cutting process, one or more other applicable processes, or a combination thereof. After the planarization process, top surfaces of the conductive pillar 109 are substantially level with a top surface of the molding compound layer 125.

Figure 1D:
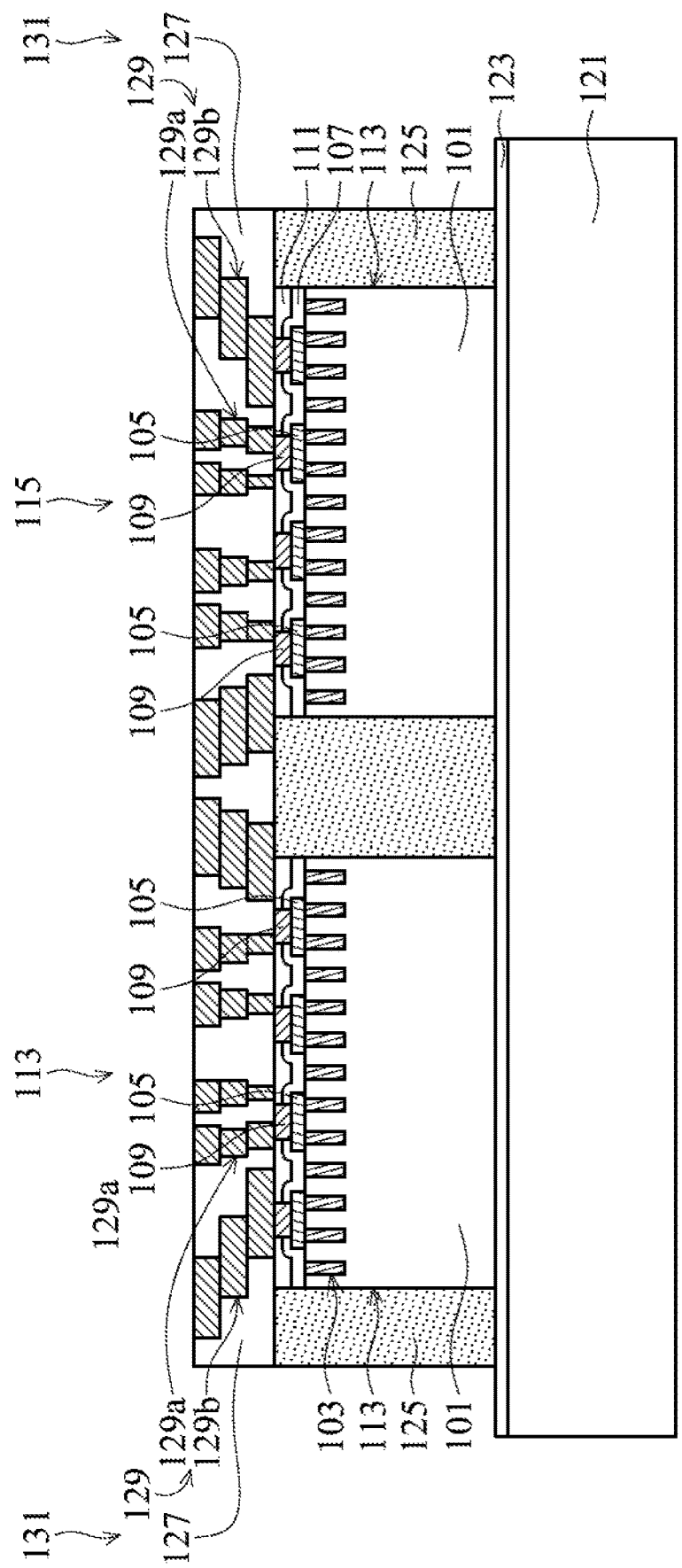

After the molding compound layer 125 is formed, a redistribution structure 131 is formed over the molding compound layer 125 and the interposers 113 and 115, as shown in FIG. 1D in accordance with some embodiments. The redistribution structure 131 may include a dielectric structure 127 which is constructed of a plurality of dielectric layers. A conductive structure 129 may be formed in the dielectric structure 127.

In some embodiments, the conductive structure 129 includes a plurality of stacking vias 129a and a plurality of wires 129b. In particular, the stacking vias 129a may be used to form electrical connections between the underlying interposers 113 and 115 and the overlying semiconductor dies formed subsequently, and the wires 129b may be used to form electrical connections between the underlying interposers 113 and 115 and the overlying surface-mount devices (SMDs) formed subsequently. In some embodiments, each of the stacking vias 129a includes at least two conductive vias that partially overlap each other.

Although three layers of the dielectric layers in the dielectric structure 127 are illustrated in FIG. 1D, the number of dielectric layer in the dielectric structure 127 is not limited thereto. For example, the dielectric structure 127 has 2 to 3 dielectric layers, in accordance with some embodiments.

In some embodiments, the dielectric layers of the dielectric structure 127 are made of silicon oxide, silicon nitride, silicon carbide, silicon oxynitride, or a combination thereof, and the dielectric layers are formed by deposition process, such as CVD process, spin-on coating process, or a combination thereof. In some embodiments, the stacking vias 129a and the wires 129b of the conductive structure 129 are made of copper, cobalt, titanium, aluminum, tungsten, gold, platinum, nickel, or a combination thereof, and the stacking vias 129a and the wires 129b of the conductive structure 129 are formed by one or more etching processes and deposition processes.

Figure 1E:
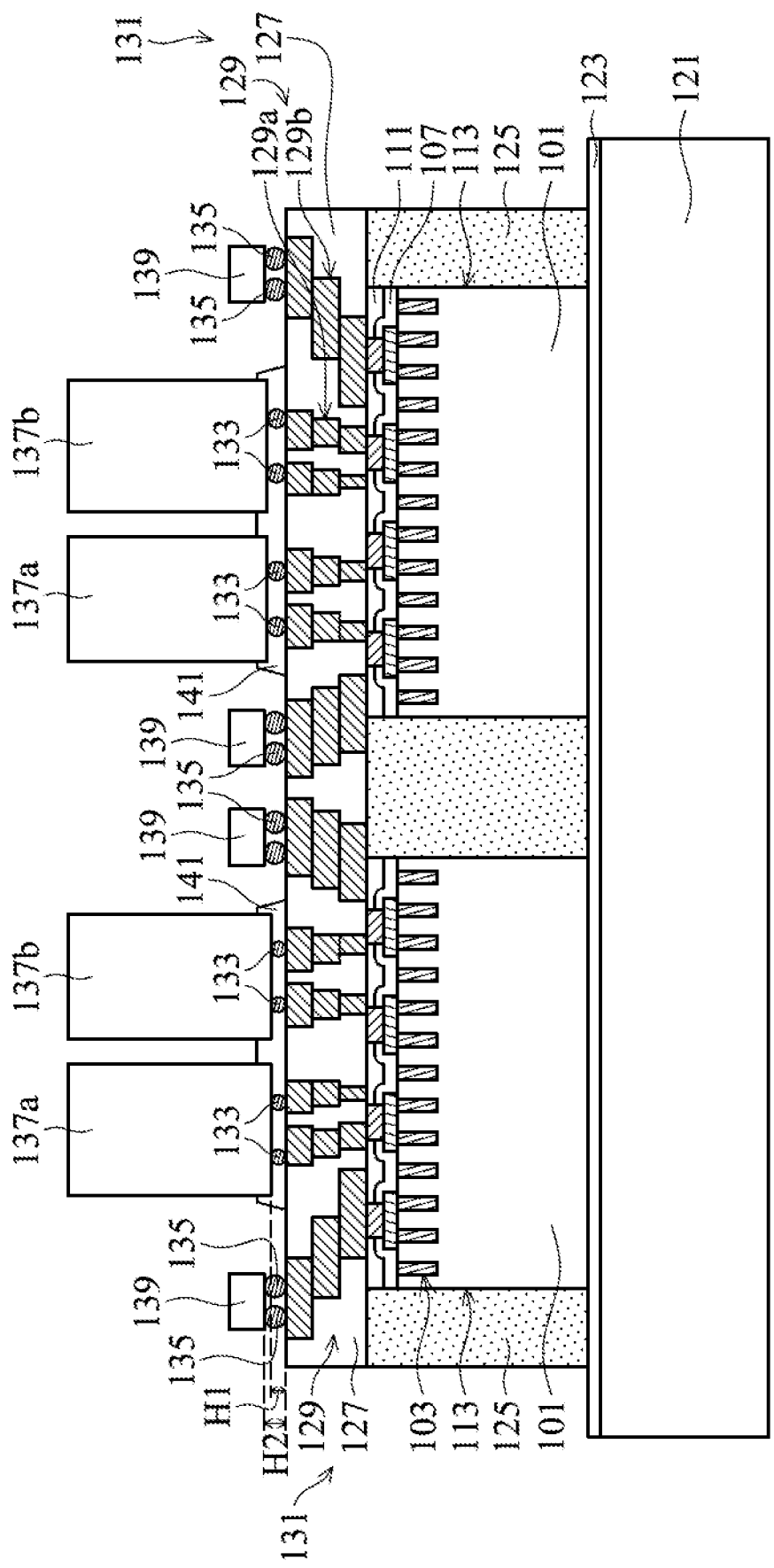

After the redistribution structure 131 is formed, a plurality of first semiconductor dies 137a and a plurality of second semiconductor dies 137b are bonded to the redistribution structure 131 through a plurality of connectors 133, as shown in FIG. 1E in accordance with some embodiments. In some embodiments, the first semiconductor dies 137a and the second semiconductor dies 137b are logic dies, system-on-chip (SoC) dies, memory dies, or other applicable dies. The memory dies may include memory devices such as static random access memory (SRAM) devices, dynamic random access memory (DRAM) devices, other suitable devices, or a combination thereof.

In some embodiments, the first semiconductor dies 137a are SoC dies, and the second semiconductor dies 137b are memory dies which function as high bandwidth memories (HBM). In some embodiments, the first semiconductor dies 137a and the second semiconductor dies 137b are SoC dies.

In some embodiments, the connectors 133 are micro-bumps with diameters less than about 50 µm. In some embodiments, the diameters of the connectors 133 are in a range from about 30 µm to about 50 µm. The connectors 133 are used to form electrical connections between the first semiconductor dies 137a and the stacking vias 129a and to form electrical connections between the second semiconductor dies 137b and the stacking vias 129a.

After the first semiconductor dies 137a and the second semiconductor dies 137b are bonded to the redistribution structure 131 through the connectors 133, an underfill layer 141 is formed in the gaps between the first semiconductor dies 137a, the second semiconductor dies 137b, the connectors 133 and the redistribution structure 131, as shown in FIG. 1E in accordance with some embodiments. As a result, the connectors 133 can be embedded in and protected by the underfill layer 141.

The underfill layer 141 may include liquid epoxy, deformable gel, silicon rubber, another suitable material, or a combination thereof. In addition, a dispensing process is performed to form the underfill layer 141 by using a dispensing needle or another applicable dispensing tool, and then the material of the underfill layer 141 is cured to harden.

Moreover, a plurality of surface-mount devices (SMDs) 139 are bonded to the redistribution structure 131 through a plurality of connectors 135, as shown in FIG. 1E in accordance with some embodiments. In some embodiments, the SMDs 139 are passive components (e.g., resistors, inductors, capacitors) or active components (e.g., transistors). In some embodiments, the connectors 135 are controlled collapse chip connection (C4) bumps with diameters that range from about 50 µm to about 120 µm. The connectors 135 are used to form electrical connections between the SMDs 139 and the wires 129b.

Moreover, the size of the connectors 135 may be larger than the size of the connectors 133. In some embodiments, the connectors 133 have a first height $H_1$, the connectors 135 have a second height $H_2$, and the second height $H_2$ is greater than the first height $H_1$, as shown in FIG. 1E in accordance with some embodiments. It should be noted that, after the first semiconductor dies 137a, the second semiconductor dies 137b and the SMDs 139 are bonded to the redistribution structure 131, the bottom surfaces of the first semiconductor dies 137a and the bottom surfaces of the second semiconductor dies 137b are lower than the bottom surfaces of the SMDs 139, in accordance with some embodiments.

Moreover, in some embodiments, the SMDs 139 are disposed directly over a portion of the molding compound layer 125. More specifically, each of the SMDs 139 is disposed across any of the interfaces between the molding compound layer 125 and the interposers 113 or 115. In some embodiments, the wires 129b, which are used to form electrical connections between the SMDs 139 and the interposers 113 and 115, extend across the aforementioned interfaces between the molding compound layer 125 and the interposers 113 or 115. In some embodiments, the interposers 113 and 115 have no portions directly under the SMDs 139 (not shown).

The connectors 133 and 135 may be made of copper, cobalt, titanium, aluminum, gold, tungsten, platinum, nickel, tantalum, indium, tin, one or more other applicable solder material, or a combination thereof. The formation method of the connectors 133 and 135 may involve an electroplating process, an electroless plating process, a sputtering process, a physical vapor deposition (PVD) process, one or more other applicable processes, or a combination thereof.

Figure 1F:
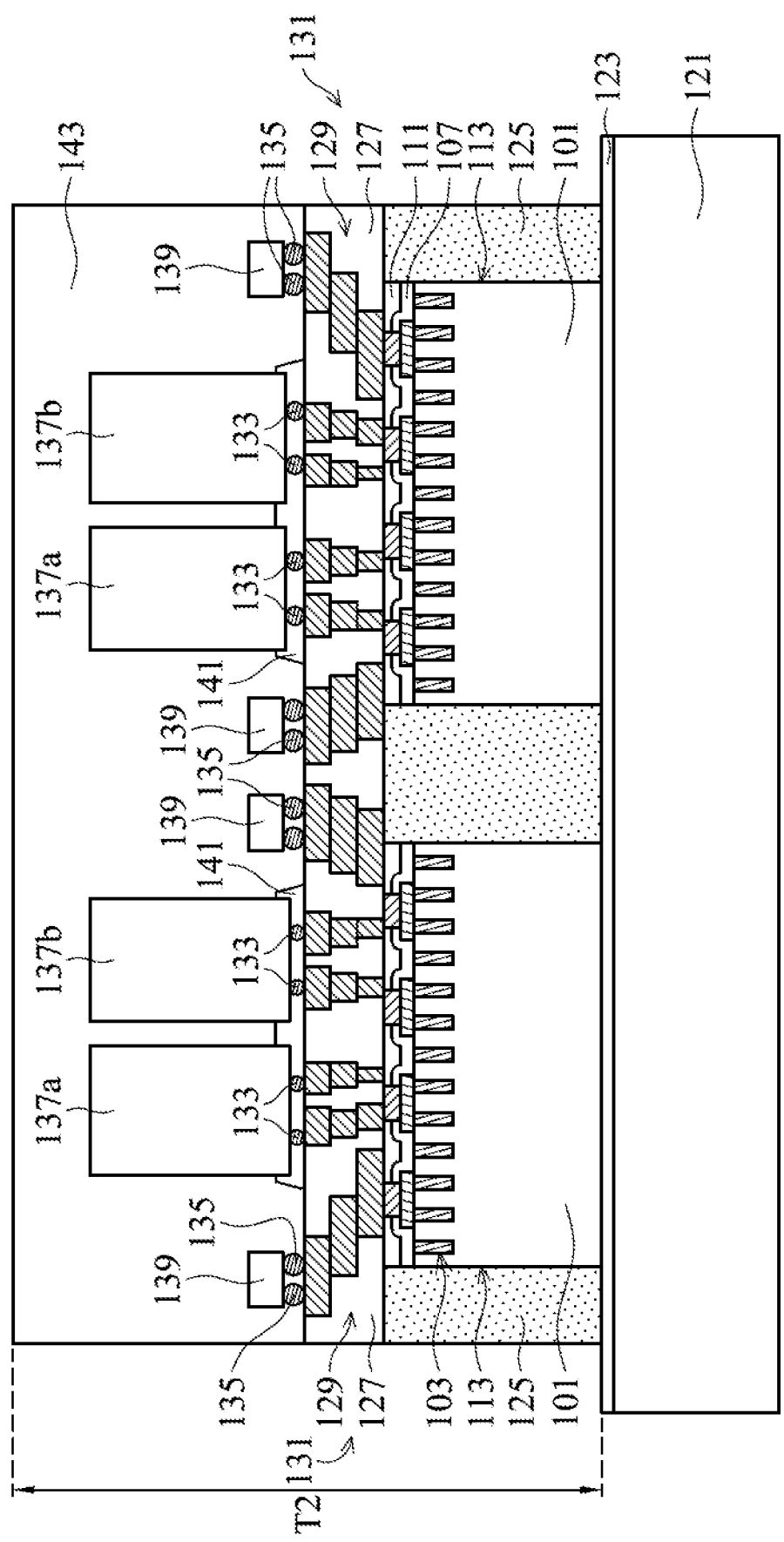

Afterwards, a molding compound layer 143 is formed covering the first semiconductor dies 137a, the second semiconductor dies 137b and the SMDs 139, as shown in FIG. 1F in accordance with some embodiments. Some materials and processes used to form the molding compound layer 143 may be similar to, or the same as, those used to form the molding compound layer 125 described previously and are not repeated herein. Moreover, the molding compound layer 125, the redistribution structure 131, and the molding compound layer 143 may have a total thickness $T_2$. In some embodiments, the total thickness $T_2$ is in a range from about 2150 µm to about 2250 µm.

Figure 1G:
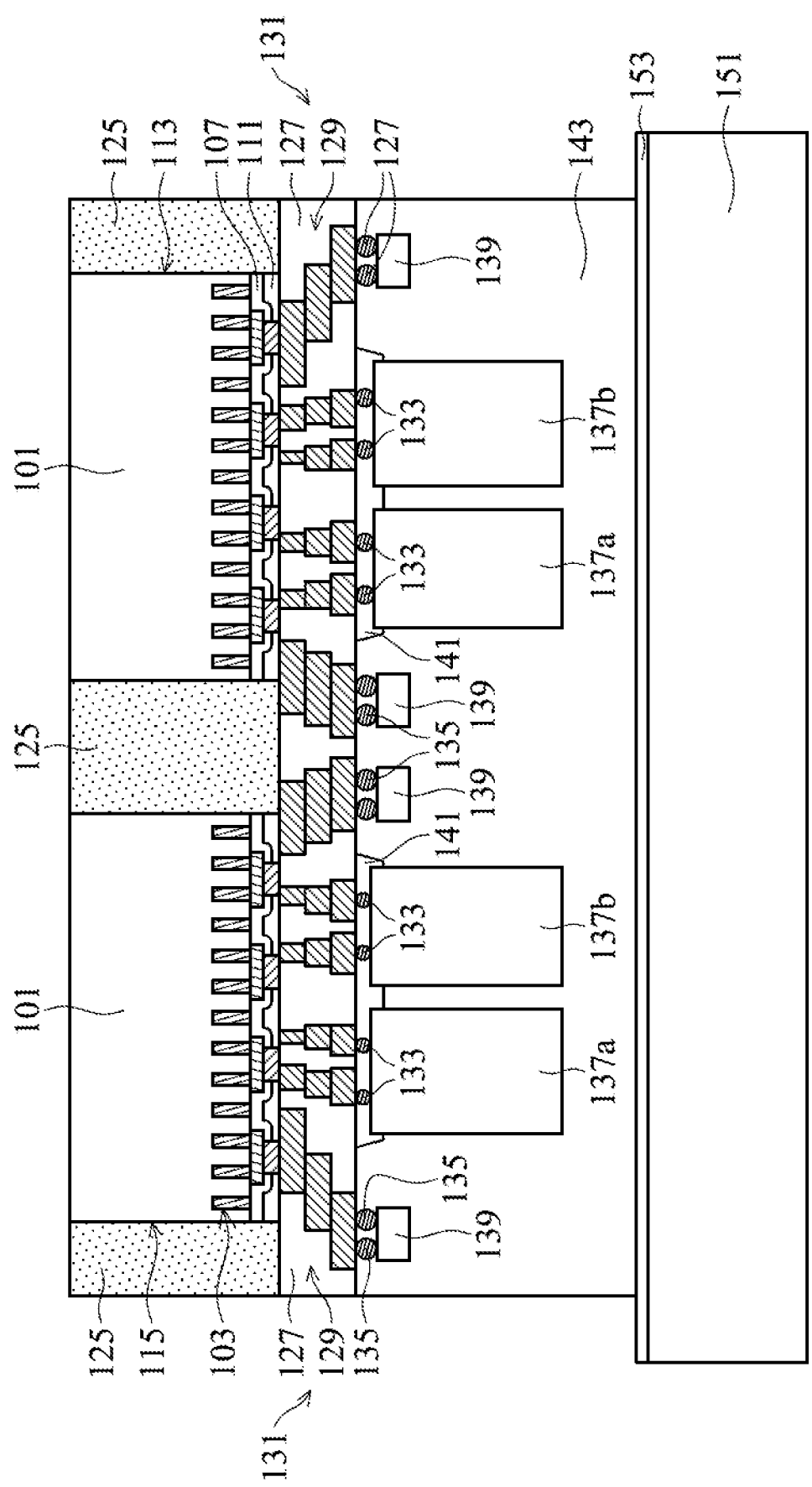

After the molding compound layer 143 is formed, the molding compound layer 125, the redistribution structure 131 and the molding compound layer 143, which are bonded together, are turned upside down and placed over a second carrier substrate 151, as shown in FIG. 1G in accordance with some embodiments. The second carrier substrate 151 may be used as a temporary substrate, and the temporary substrate may provide mechanical and structural support during subsequent processing steps. In some embodiments, the molding compound layer 143 of the structure in FIG. 1F is attached to the second carrier substrate 151 by an adhesive layer 153.

Some materials and processes used to form the second carrier substrate 151 and the adhesive layer 153 may be similar to, or the same as, those used to form the first carrier substrate 121 and the adhesive layer 123 described previously and are not repeated herein. In addition, the first carrier substrate 121 and the adhesive layer 123 are removed so as to expose the surface of the molding compound layer 125, as shown in FIG. 1G in accordance with some embodiments.

Figure 1H:
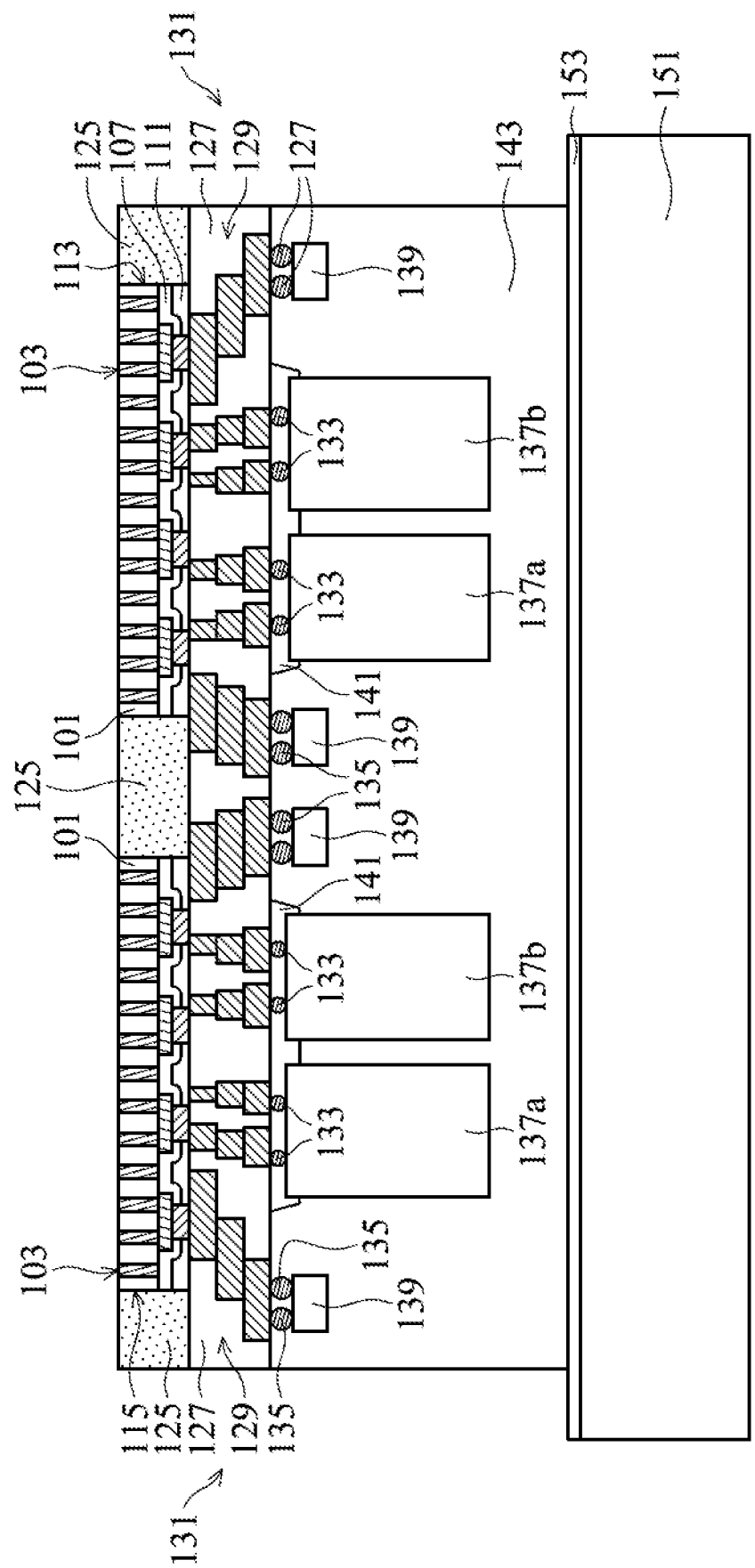

Next, the molding compound layer 125, the interposers 113 and 115 are thinned from their exposed surfaces by using a planarization process, as shown in FIG. 1H in accordance with some embodiments. The planarization process may include a grinding process, a CMP process, a dry polishing process, an etching process, a cutting process, one or more other applicable processes, or a combination thereof. After the planarization process, a portion of the molding compound layer 125 and a portion of the substrate 101 are removed, and the through vias 103 are exposed and penetrate through the substrate 101, in accordance with some embodiments.

Figure 1I:
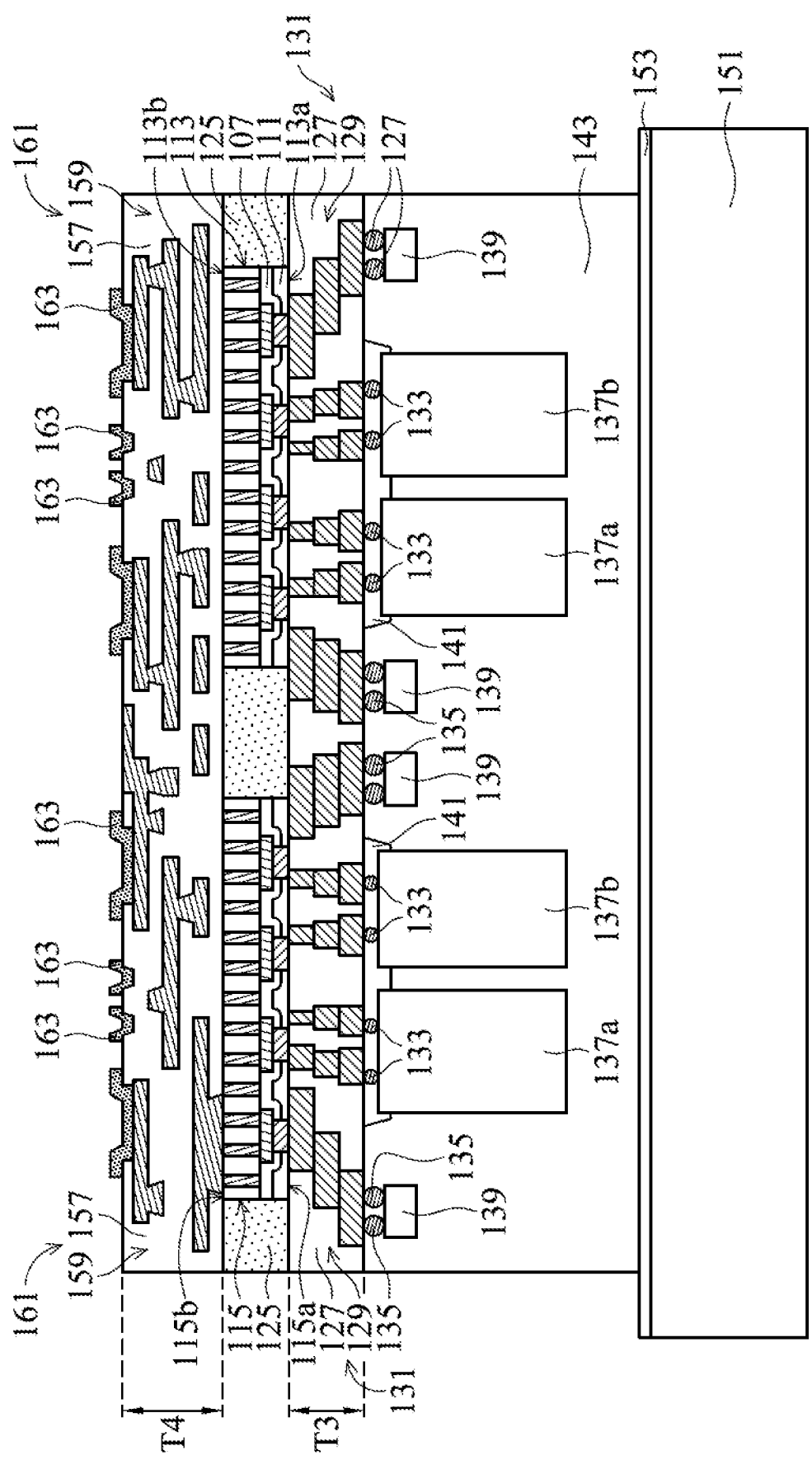

Afterwards, a redistribution structure 161 is formed over the molding compound layer 125 and the interposers 113 and 115, as shown in FIG. 1I in accordance with some embodiments. The redistribution structure 161 may include a dielectric structure 157 which is constructed of a plurality of dielectric layers. A conductive structure 159 may be formed in the dielectric structure 157.

In some embodiments, the conductive structure 159 includes a plurality of conductive vias and/or conductive layers that are used to form electrical connections between the interposers 113, 115 and the connectors which will be subsequently formed over the redistribution structure 161. Moreover, the conductive structure 159 of the redistribution structure 161 is partially exposed by a plurality of openings in the dielectric structure 157, and a plurality of under bump metallurgy (UBM) structures 163 fill the openings and extend over the redistribution structure 161, as shown in FIG. 1I in accordance with some embodiments.

Each of the UBM structures 163 may include one or more layers, such as a barrier layer and a seed layer. In some embodiments, each of the UBM structures 163 including a single layer is depicted herein as an example. The UBM structures 163 may be made of titanium, titanium nitride, tantalum, tantalum nitride, tungsten, titanium tungsten, nickel, gold, chrome, copper, copper alloy, another applicable material, or a combination thereof. In addition, the UBM structure 163 may be formed by using an electroplating method.

Although there are six layers of the conductive structure 159, illustrated in FIG. 1I, the number of layer in the conductive structure 159 is not limited thereto. For example, the conductive structure 159 has 4 to 7 layers, in accordance with some embodiments. In some embodiments, the redistribution structure 131 has a thickness $T_3$, the redistribution structure 161 has a thickness $T_4$, and the thickness $T_4$ is greater than the thickness $T_3$.

The interposer 113 has a first surface 113a and a second surface 113b opposite the first surface 113a, and the interposer 115 has a first surface 115a and a second surface 115b opposite the first surface 115a. It should be noted that the redistribution structures 131 and 161 are over two opposite surfaces of the interposers 113 and 115, in accordance with some embodiments.

More specifically, in some embodiments, the redistribution structure 131 is over the first surface 113a of the interposer 113 and the first surface 115a of the interposer 115, and the redistribution structure 161 is over the second surface 113b of the interposer 113 and the second surface 113b of the interposer 115. In some embodiments, the molding compound layer 125 is sandwiched between, and in direct contact with, the redistribution structures 131 and 161.

Figure 1J:
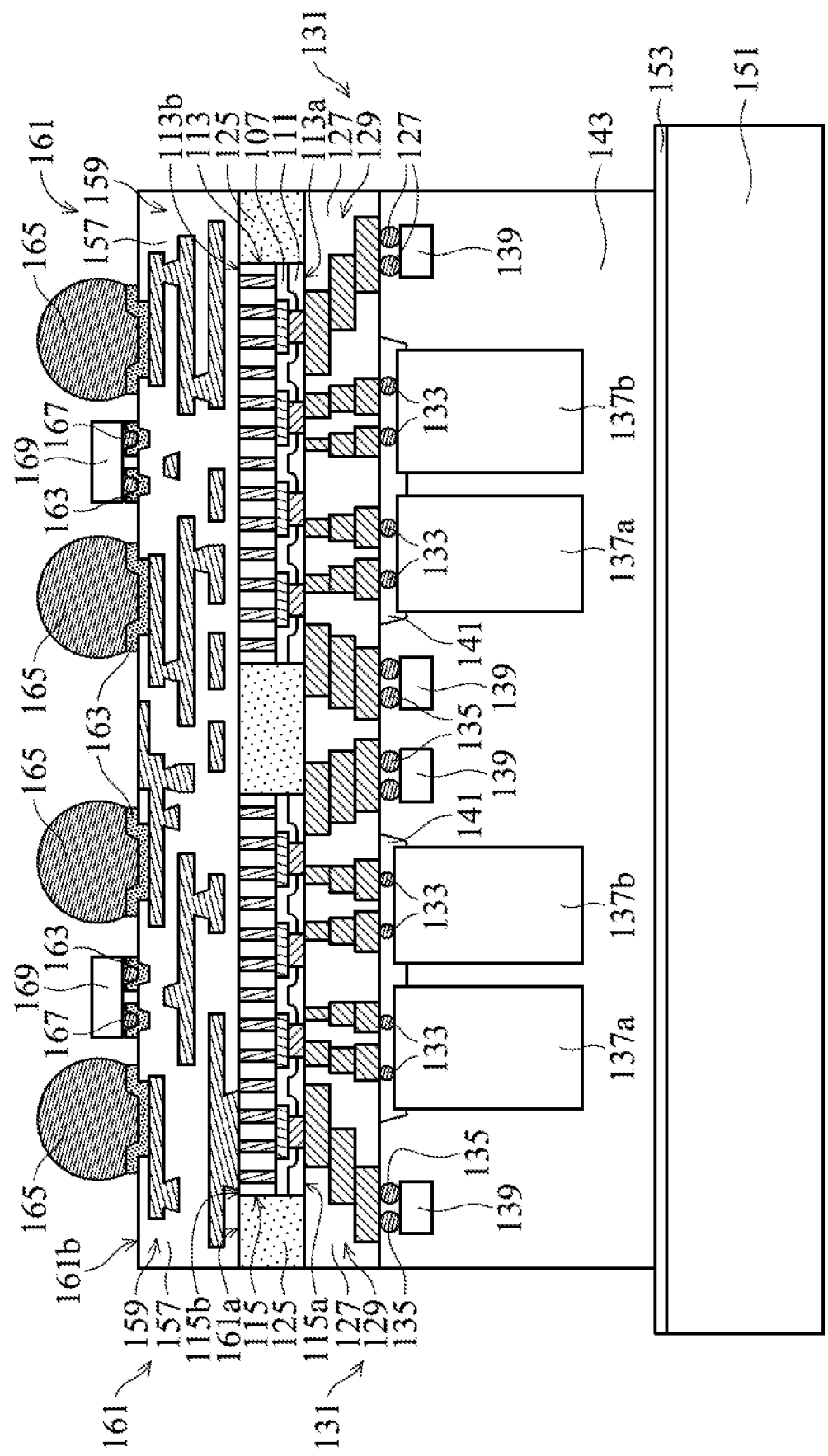

After the UBM structures 163 are formed, a plurality of connectors 165 are formed over the UBM structures 163, and a plurality of capacitors 169 are bonded to the redistribution structure 161 through a plurality of connectors 167, as shown in FIG. 1J in accordance with some embodiments. In some embodiments, the UBM structures 163 are used to form electrical connections between the connectors 165 and the redistribution structure 161, and the capacitors 169 are electrical connected to the redistribution structure 161 through the connectors 167 and the UBM structures 163 under the connectors 167.

In some embodiments, the connectors 165 are ball grid array (BGA) bumps with diameters in a range from about 150 µm to about 250 Similar to the connectors 135, the connectors 167 may be controlled collapse chip connection (C4) bumps. In some embodiments, the sizes of the connectors 165 are greater than the sizes of the connectors 167, 135 and 133. Some materials and processes used to form the connectors 165 and 167 may be similar to, or the same as, those used to form the connectors 133 and 135 described previously and are not repeated herein.

In addition, the redistribution structure 161 has a first surface 161a facing the interposers 113 and 115, and the redistribution structure 161 has a second surface 161b opposite the first surface 161a. In some embodiments, the capacitors 169 are mounted on the second surface 161b of the redistribution structure 161, and the connectors 165 are bonded to the second surface 161b of the redistribution structure 161. It should be noted that the performance of the finished package structure (e.g., the package structure 100 in FIG. 1L) may be improved by the capacitors 169.

Figure 1K:
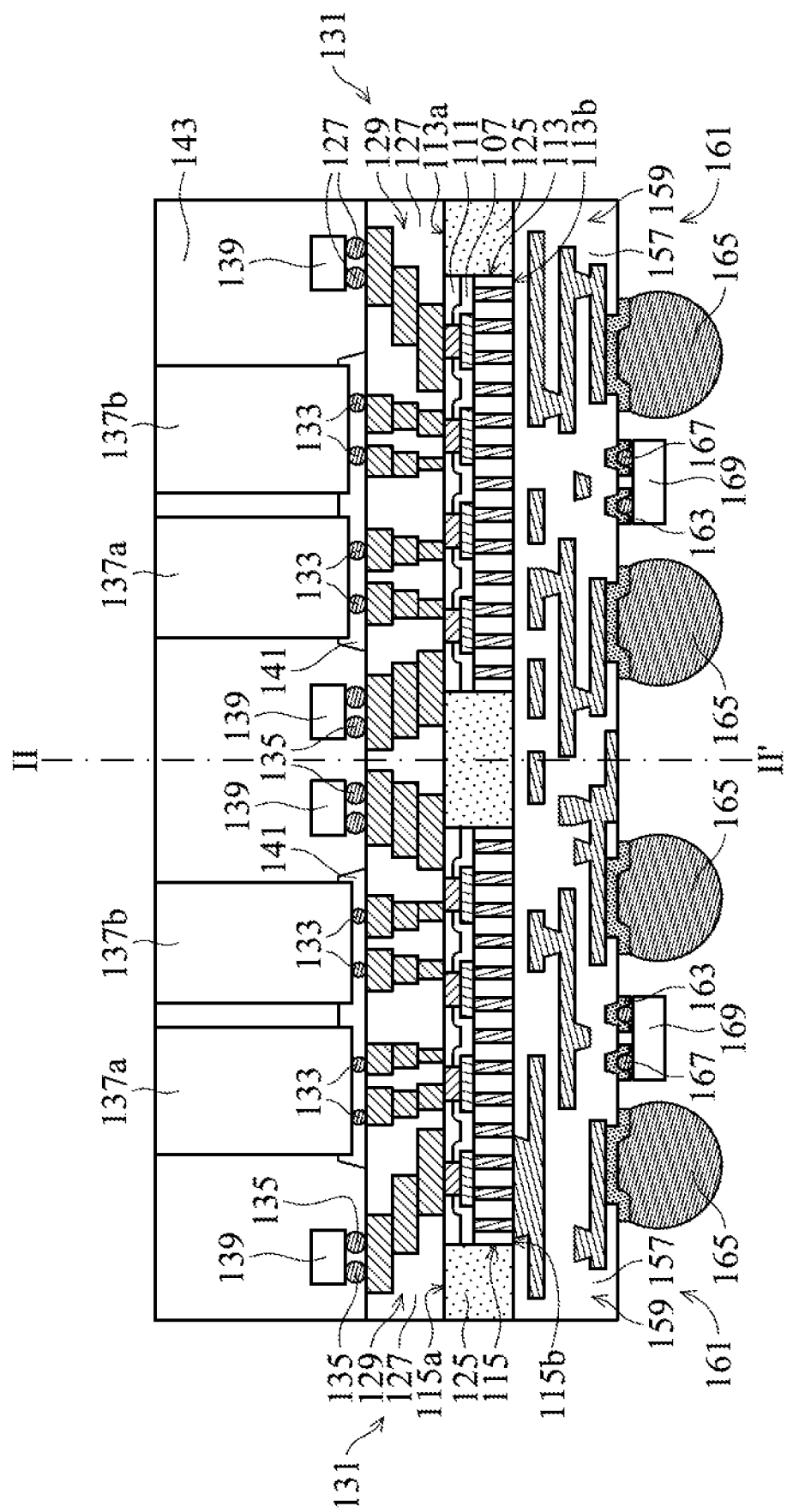

Afterwards, the molding compound layer 143, the redistribution structure 131, the molding compound layer 125 and the redistribution structure 161, which are bonded together, are turned upside down, the second carrier substrate 151 and the adhesive layer 153 are removed, and a portion of the molding compound layer 143 are thinned by using a planarization process, as shown in FIG. 1K in accordance with some embodiments.

The planarization process may include a grinding process, a CMP process, a dry polishing process, an etching process, a cutting process, one or more other applicable processes, or a combination thereof. After the planarization process, the first semiconductor dies 137a and the second semiconductor dies 137b are exposed so as to enhance heat dissipation of the first semiconductor dies 137a and the second semiconductor dies 137b.

After the planarization process, the molding compound layer 143, the redistribution structure 131, the molding compound layer 125 and the redistribution structure 161, which are bonded together, are placed over a support frame structure (not shown), and a dicing process is performed to cut the molding compound layer 143, the redistribution structure 131, the molding compound layer 125 and the redistribution structure 161 along scribe line in accordance with some embodiments.

Figure 1L:
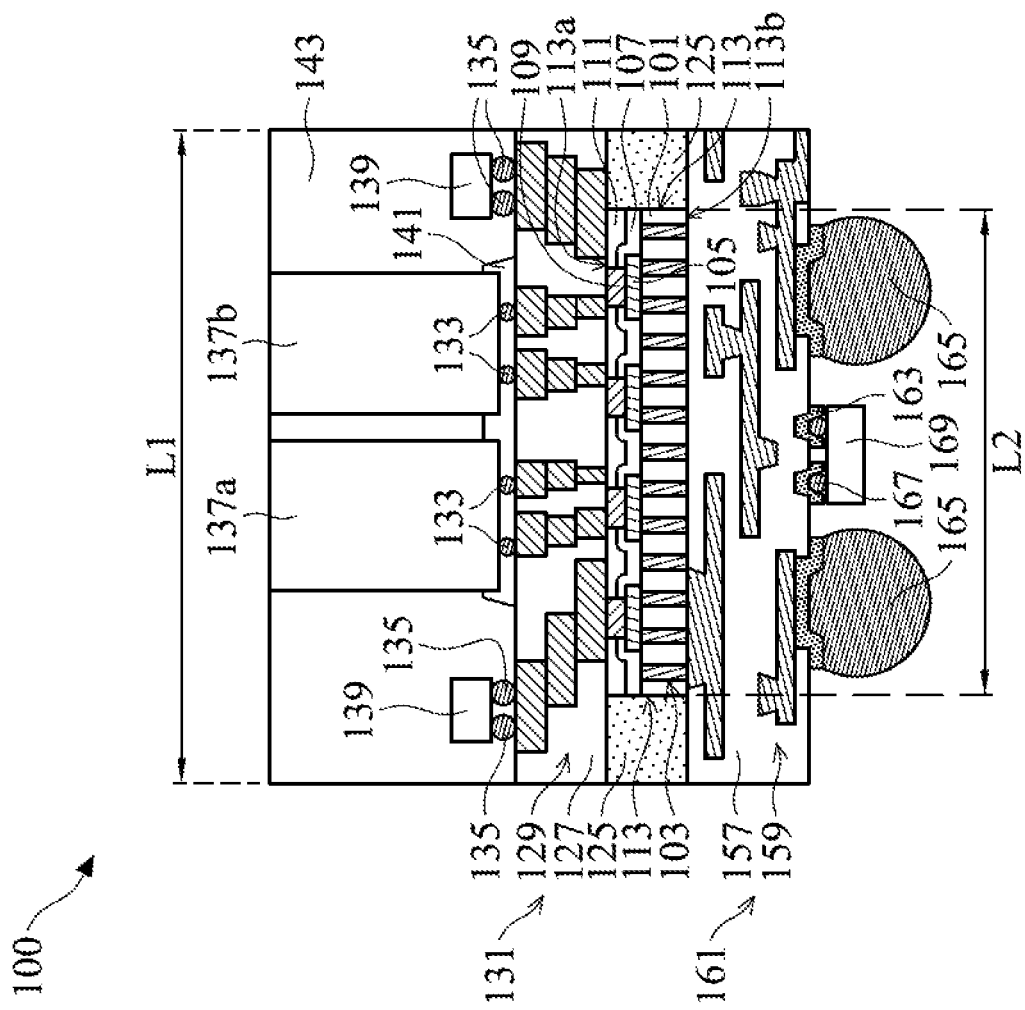

The molding compound layer 143, the redistribution structure 131, the molding compound layer 125 and the redistribution structure 161 are diced to form a plurality of package structures 100, as shown in FIG. 1L in accordance with some embodiments. The redistribution structure 131 has a first length $L_1$, and the interposer 113 has a second length $L_2$. In some embodiments, the length of the redistribution structure 161 is substantially the same as the first length $L_1$, and the first length $L_1$ is larger than the second length $L_2$. Moreover, it should be noted that the redistribution structure 131, the interposer 113, the molding compound layer 125 and the redistribution structure 161 may form a hybrid interposer structure.

In the package structure 100, the SMDs 139 can be mounted over the hybrid interposer structure and electrically connected to the interposer 113 through the redistribution structure 131 of the hybrid interposer structure. Since the SMDs 139 can be integrated into the package structure 100, there is no need to bond the package structure 100 to an additional substrate (e.g., a printed circuit board (PCB)) to provide electrical connections between the SMDs 139 and the interposer 113.

Although the package structure 100 is a chip-on-wafer (CoW) structure, the package structure 100 may function as a chip-on-wafer-on-substrate (CoWoS) structure because of a the two redistribution structures 131 and 161 on opposite sides of the interposer 113. The aforementioned hybrid interposer substrate (including the redistribution structure 131, the interposer 113, the molding compound layer 125 and the redistribution structure 161) may provide benefits by lowering associated costs, scaling down the overall size of the package structures, and allowing the formations of super large package structures, which are greater than 32 mm×26 mm.

FIGS. 2A to 2D are cross-sectional views of various stages of a process for forming a package structure 200, in accordance with some embodiments of the disclosure. Some processes for forming the package structure 200 shown in FIGS. 2A to 2D may be similar to, or the same as, those for forming the package structure 100 shown in FIGS. 1F to 1L.

Figure 2A:
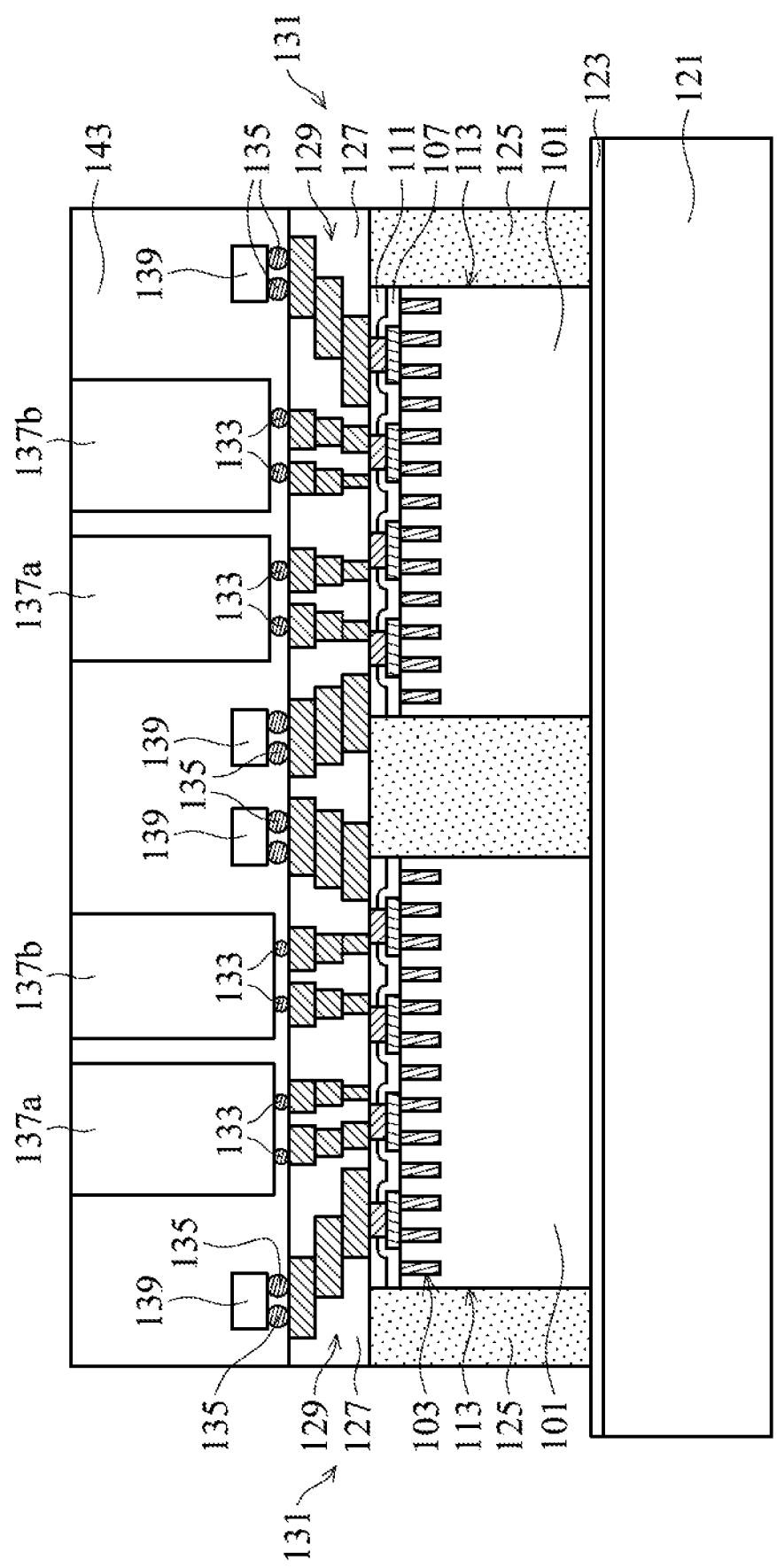
FIGS. 2A to 2D are cross-sectional views of various stages of a process for forming a package structure, in accordance with some embodiments of the disclosure.

A structure similar to the structure shown in FIG. 1F is attached onto the first carrier substrate 121 through the adhesive layer 123, as shown in FIG. 2A in accordance with some embodiments. One of the differences between the structures of FIG. 1F and FIG. 2A is that the underfill layer 141 is not formed in FIG. 2A, in accordance with some embodiments. Therefore, in some embodiments, the connectors 133 are protected and in direct contact with the molding compound layer 143.

In addition, the other difference between the structures of FIG. 1F and FIG. 2A is that the a planarization process is performed on the molding compound layer 143 to expose the first semiconductor dies 137a and the second semiconductor dies 137b before the second carrier substrate 151 is attached to the molding compound layer 143 through the adhesive layer 153, in accordance with some embodiments. The planarization process may include a grinding process, a CMP process, a dry polishing process, an etching process, a cutting process, one or more other applicable processes, or a combination thereof.

Next, in some embodiments, a process similar to the process shown in FIG. 1G is performed on the structure of FIG. 2A, the molding compound layer 125, the redistribution structure 131 and the molding compound layer 143, which are bonded together, are turned upside down and attached to the second carrier substrate 151 through the adhesive layer 153.

In some embodiments, since the first semiconductor dies 137a and the second semiconductor dies 137b have already been exposed by the molding compound layer 143, the first semiconductor dies 137a and the second semiconductor dies 137b are in direct contact with the adhesive layer 153, or in direct contact with the second carrier substrate 151 if the adhesive layer 153 is not formed.

Figure 2B:
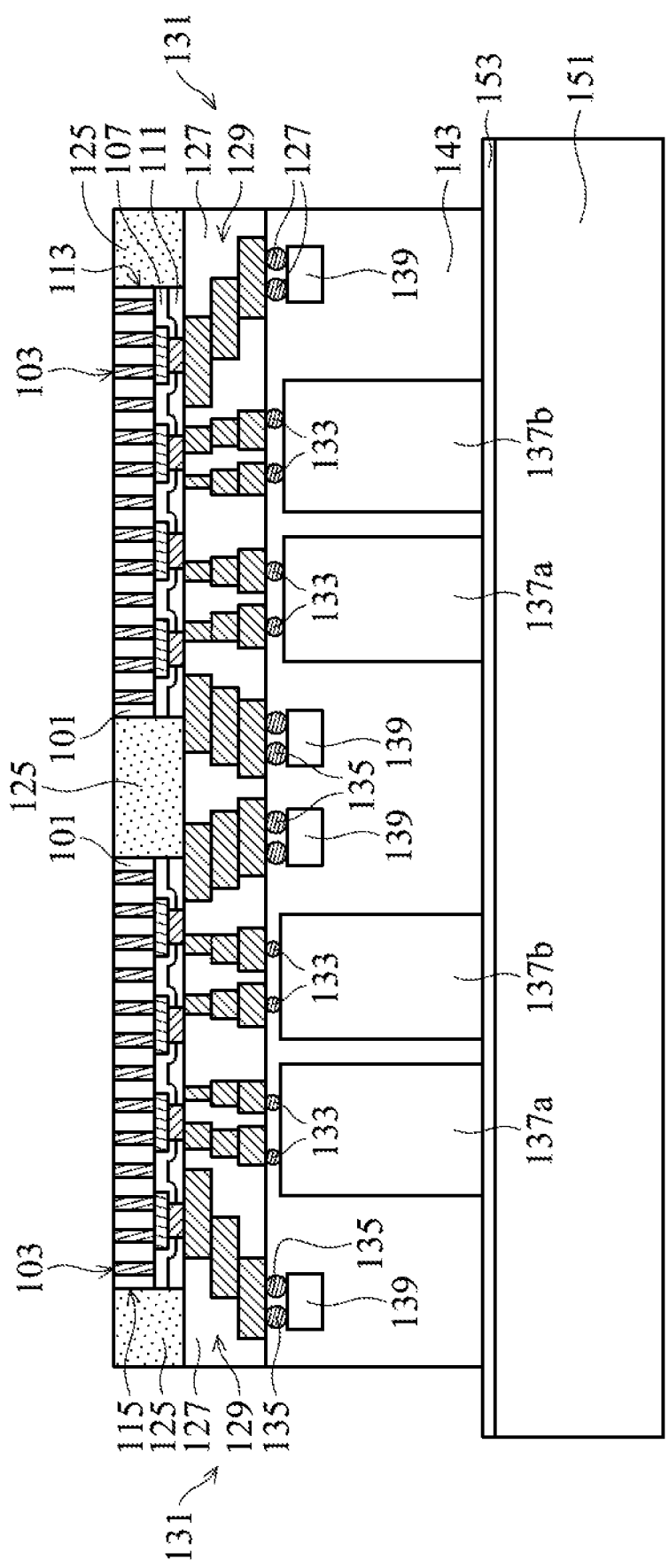

Afterwards, similar to the process shown in FIG. 1H, the molding compound layer 125, the interposers 113 and 115 are thinned by using a planarization process, as shown in FIG. 2B in accordance with some embodiments. After the planarization process, a portion of the molding compound layer 125 and a portion of the substrate 101 are removed, and the through vias 103 are exposed and penetrate through the substrate 101, in accordance with some embodiments.

Figure 2C:
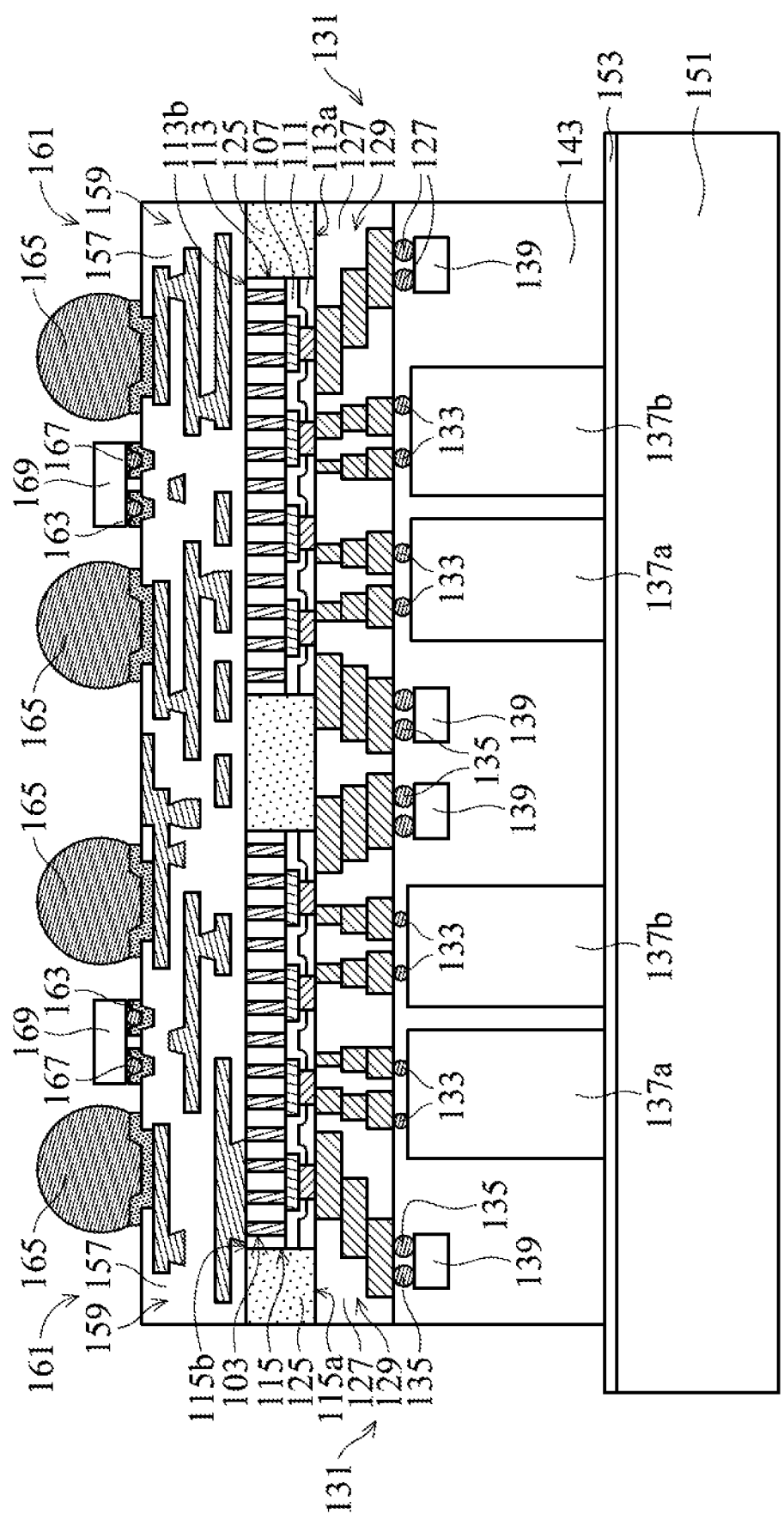

After the through vias 103 are exposed, processes similar to the processes shown in FIGS. 1I to 1J are performed on the structure of FIG. 2B, in accordance with some embodiments. In particular, the redistribution structure 161 is formed over the molding compound layer 125 and the exposed through vias 103 of the interposers 113 and 115, as shown in FIG. 2C in accordance with some embodiments. In addition, the UBM structures 163 and the connectors 165 are formed over the redistribution structure 161, in accordance with some embodiments.

Figure 2D:
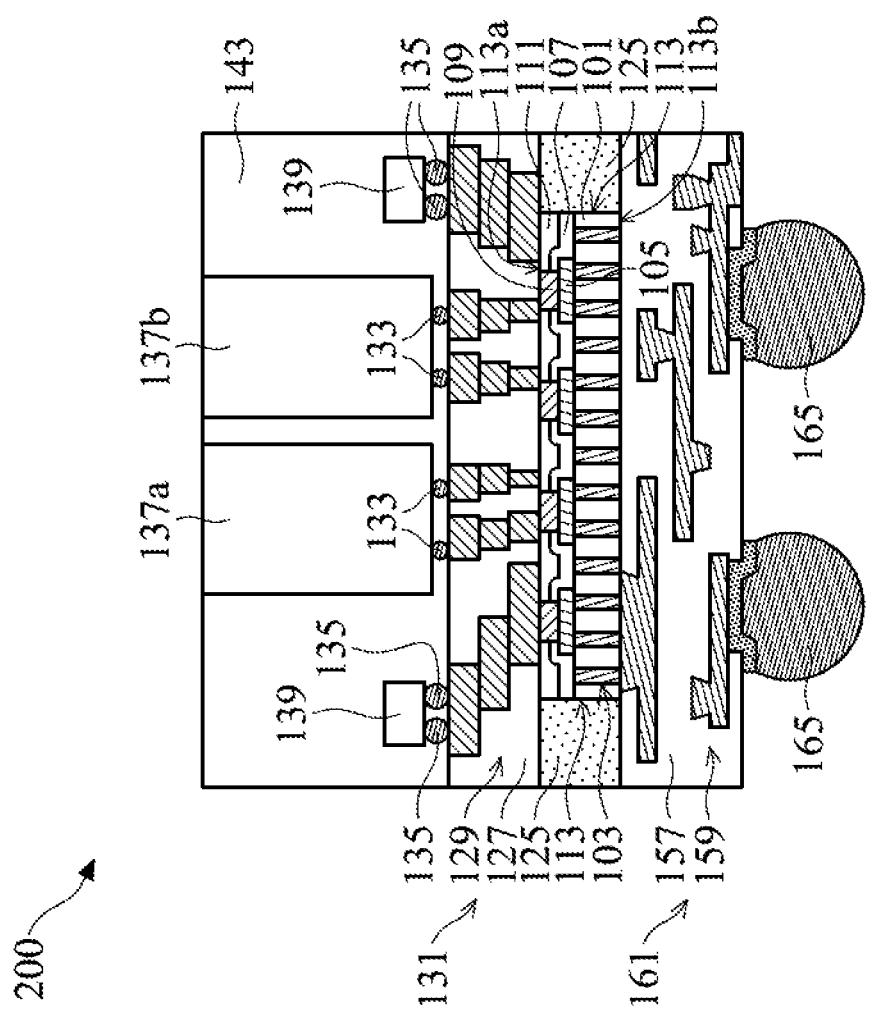

Next, the structure of FIG. 2C is diced to form a plurality of package structures 200, and the redistribution structure 131, the molding compound layer 125 and the redistribution structure 161 form a hybrid interposer structure in the package structure 200, as shown in FIG. 2D in accordance with some embodiments.

In the embodiments of the package structures 100 and 200, the SMDs 139 can be mounted over the hybrid interposer structure and electrically connected to the interposer 113 through the redistribution structure 131 of the hybrid interposer structure. Since the SMDs 139 can be integrated into the package structures 100 and 200, there is no need to bond the package structure 100 to an additional substrate (e.g., a printed circuit board (PCB)) to provide electrical connections between the SMDs 139 and the interposer 113.

Although the package structures 100 and 200 are chip-on-wafer (CoW) structures, the package structures 100 and 200 may function as chip-on-wafer-on-substrate (CoWoS) structures because of the two redistribution structures 131 and 161 on opposite sides of the interposer 113. The aforementioned hybrid interposer substrate (including the redistribution structure 131, the interposer 113, the molding compound layer 125 and the redistribution structure 161) may provide benefits by lowering associated costs, scaling down the overall size of the package structures, and allowing the formation of super large package structures.

Embodiments of a package structure and methods for forming the same are provided. The package structure may include a first redistribution structure and an interposer over the first redistribution structure. The package structure may also include a molding compound layer surrounding the interposer, and a second redistribution structure over the interposer. The first and second redistribution structures are disposed over two opposite sides of the interposer, and a hybrid interposer structure may be formed by the first and second redistribution structures, the interposer and the molding compound layer. Since electrical components (e.g., surface-mount devices) can be integrated into the package structure, it is advantages for the associated costs to be lowered and the overall size to be reduced. In addition, the formations of super large package structures are allowed.

In some embodiments, a method for forming a package structure is provided. The method includes forming a first molding compound layer surrounding a first interposer. The method also includes forming a first redistribution structure over a first side of the first interposer and the first molding compound layer. The method also includes bonding a first semiconductor die and a second semiconductor die to the first redistribution structure through a plurality of first connectors. The method also includes bonding a surface-mount device (SMD) to the first redistribution structure through a second connector. The method also includes forming a second redistribution structure over a second side of the first interposer opposite the first side of the first interposer. A top surface of the surface-mount device (SMD) is lower than top surfaces of the first semiconductor die and the second semiconductor die.

In some embodiments, a method for forming a package structure is provided. The method for forming a package structure includes forming a first redistribution structure over a first side of an interposer. The method for forming a package structure also includes bonding a semiconductor die and a surface-mount device (SMD) to the first redistribution structure. The method for forming a package structure also includes forming a second molding compound layer covering the semiconductor die and the SMD. The method for forming a package structure also includes flipping over the interposer. The method for forming a package structure also includes forming a second redistribution structure over a second side of the interposer. The method for forming a package structure also includes bonding a capacitor to the second redistribution structure.

In some embodiments, a method for forming a package structure is provided. The method for forming a package structure includes forming a through via in a substrate. The method for forming a package structure also includes forming a conductive pad over the through via. The method for forming a package structure also includes forming a passivation layer covering the conductive pad. The method for forming a package structure also includes forming a conductive pillar over the conductive pad through the passivation layer. The method for forming a package structure also includes forming a polymer layer covering the conductive pillar and the passivation layer. The method for forming a package structure also includes dicing the substrate, the passivation layer, and the polymer layer to form an interposer. The method for forming a package structure also includes forming a first molding compound layer surrounding the interposer. The method for forming a package structure also includes forming a first redistribution structure and a second redistribution structure over opposite sides of the interposer. The method for forming a package structure also includes bonding a surface-mount device (SMD) to the first redistribution structure.

In some embodiments, a package structure is provided. The package structure includes a first redistribution structure and an interposer over the first redistribution structure. The package structure also includes a molding compound layer surrounding the interposer, and a second redistribution structure over the interposer. The molding compound layer is between the first redistribution structure and the second redistribution structure. The package structure further includes a first semiconductor die and a second semiconductor die over the second redistribution structure.

In some embodiments, a package structure is provided. The package structure includes a first redistribution structure and an interposer over the first redistribution structure. The interposer includes a conductive pad over a substrate, and a conductive pillar over the conductive pad. The package structure also includes a second redistribution structure over the interposer. The package structure further includes a first semiconductor die, a second semiconductor die and a surface-mount device (SMD) over the second redistribution structure. The first semiconductor die is electrically connected to the conductive pillar through the second redistribution structure.

In some embodiments, a method for forming a package structure is provided. The method for forming a package structure includes forming a first molding compound layer surrounding a first interposer, and forming a first redistribution structure over a first side of the first interposer and the first molding compound layer. The method for forming a package structure also includes bonding a first semiconductor die and a second semiconductor die to the first redistribution structure through a plurality of first connectors, and forming a second redistribution structure over a second side of the first interposer opposite the first side of the first interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   forming a first molding compound layer surrounding a first interposer;
   after forming the first molding compound layer, forming a first redistribution structure over a first side of the first interposer and the first molding compound layer;
   bonding a first semiconductor die and a second semiconductor die to the first redistribution structure through a plurality of first connectors;
   bonding a surface-mount device (SMD) to the first redistribution structure through a second connector; and
   after forming the first molding compound layer, forming a second redistribution structure over a second side of the first interposer opposite the first side of the first interposer,
   wherein a top surface of the surface-mount device (SMD) is lower than top surfaces of the first semiconductor die and the second semiconductor die.

2. The method for forming the package structure as claimed in claim 1, wherein a height of the second connector is greater than a height of the plurality of first connectors.

3. The method for forming the package structure as claimed in claim 1, wherein the SMD is electrically connected to the first interposer through a wire of the first redistribution structure, and the wire extends across an interface between the first molding compound layer and the first interposer.

4. The method for forming the package structure as claimed in claim 1, further comprising:
   forming a second molding compound layer covering the first semiconductor die and the second semiconductor die, wherein the first redistribution structure extends between the first molding compound layer and the second molding compound layer.

5. The method for forming the package structure as claimed in claim 4, wherein the second redistribution structure extends from the second side of the interposer to a surface of the first molding compound layer, and wherein the method for forming the package structure further comprises:
   attaching the second molding compound layer to a second carrier substrate before the second redistribution structure is formed.

6. The method for forming the package structure as claimed in claim 1, further comprising:
   forming a first conductive pillar and a second conductive pillar over an interposer wafer, wherein the interposer wafer comprises a plurality of conductive pads over a substrate, and a passivation layer partially covering the conductive pads, and wherein the first conductive pillar and the second conductive pillar are formed over the plurality of conductive pads;
   forming a polymer layer covering the passivation layer, the first conductive pillar and the second conductive pillar; and
   dicing the substrate, the polymer layer and the passivation layer to form the first interposer and a second interposer, wherein the second conductive pillar is in the second interposer.

7. The method for forming the package structure as claimed in claim 6, further comprising:
   placing the first interposer and the second interposer on a first carrier substrate;
   forming a first molding compound material covering the first interposer and the second interposer; and
   thinning the first interposer, the second interposer and the first molding compound material to form the first molding compound layer exposing the first conductive pillar and the second conductive pillar.

8. A method for forming a package structure, comprising:
   forming a first redistribution structure over a first side of an interposer, wherein the interposer has a sidewall connecting the first side and a second side;
   bonding a semiconductor die and a surface-mount device (SMD) to the first redistribution structure, wherein the SMD is electrically connected to the interposer through a wire of the first redistribution structure, and a projection of the wire on a bottom surface of the first redistribution structure extends across the sidewall of the interposer;
   forming a first molding compound layer covering the semiconductor die and the SMD;
   flipping over the interposer;
   forming a second redistribution structure over the second side of the interposer; and
   bonding a capacitor to the second redistribution structure.

9. The method for forming the package structure as claimed in claim 8, further comprising:
   attaching the first molding compound layer to a carrier substrate.

10. The method for forming the package structure as claimed in claim 9, further comprising:
    planarizing first molding compound layer to expose the semiconductor die before attaching the first molding compound layer to the carrier substrate.

11. The method for forming the package structure as claimed in claim 9, further comprising:
    forming an adhesive layer over the first molding compound layer,
    wherein the first molding compound layer is attached to the carrier substrate by the adhesive layer.

12. The method for forming the package structure as claimed in claim 8, wherein the first molding compound layer is attached to the carrier substrate after flipping over the interposer.

13. The method for forming the package structure as claimed in claim 8, wherein the first molding compound layer is filled between the SMD and the first redistribution structure.

14. The method for forming the package structure as claimed in claim 8, further comprising:
    forming an underfill layer between the semiconductor die and the first redistribution structure.

15. A method for forming a package structure, comprising:
    forming a through via in a substrate;
    forming a conductive pad over the through via;
    forming a passivation layer covering the conductive pad;
    forming a conductive pillar over the conductive pad through the passivation layer;
    forming a polymer layer covering the conductive pillar and the passivation layer;
    dicing the substrate, the passivation layer, and the polymer layer to form an interposer;
    forming a first molding compound layer surrounding the interposer;

forming a first redistribution structure and a second redistribution structure over opposite sides of the interposer; and bonding a surface-mount device (SMD) to the first redistribution structure.

16. The method for forming the package structure as claimed in claim 15, further comprising:

thinning the substrate to expose the through via before forming the second redistribution structure.

17. The method for forming the package structure as claimed in claim 16, wherein the first redistribution structure is formed over the interposer before thinning the substrate, and the second redistribution structure is formed over the interposer after thinning the substrate.

18. The method for forming the package structure as claimed in claim 15, further comprising:

planarizing the interposer to expose the conductive pillar after forming the first molding compound layer.

19. The method for forming the package structure as claimed in claim 15, further comprising:

bonding a semiconductor die to stacking vias in the first redistribution structure.

20. The method for forming the package structure as claimed in claim 15, further comprising:

forming UBM structures over the second redistribution structure; and forming a capacitor and a BGA bump over the UBM structures.

* * * * *